United States Patent [19]
Makhija

[11] Patent Number: 5,629,680
[45] Date of Patent: May 13, 1997

[54] VEHICLE CURRENT DRAIN TESTER WITH MEMORY SAVER

[76] Inventor: Surender K. Makhija, 21370 Lower Cambridge Cir., Brookfield, Wis. 53045

[21] Appl. No.: 596,411

[22] Filed: Feb. 2, 1996

Related U.S. Application Data

[63] Continuation-in-part of Ser. No. 570,589, Dec. 11, 1995.
[51] Int. Cl.$^6$ .................................. G08B 21/00
[52] U.S. Cl. .................. 340/664; 340/636; 340/458; 324/433; 320/48
[58] Field of Search .................. 340/664, 636, 340/458; 324/433, 429, 426; 320/48

[56] References Cited

U.S. PATENT DOCUMENTS

| | | | |
|---|---|---|---|
| 3,638,108 | 1/1972 | Channing | 324/433 |
| 4,019,112 | 4/1977 | Satoh | 320/48 |
| 4,109,193 | 8/1978 | Schultheis | 320/48 |
| 4,816,768 | 3/1989 | Champlin | 320/48 |
| 5,057,814 | 10/1991 | Onan et al. | 340/458 |
| 5,254,952 | 10/1993 | Salley et al. | 324/429 |
| 5,426,416 | 6/1995 | Jefferies et al. | 340/664 |

OTHER PUBLICATIONS

Mohammad Sami, "Complete Circuit," *Automotive Rebuilder*, Oct. 1993, pp. 59–61.

*Primary Examiner*—Jeffery Hofsass
*Assistant Examiner*—John A. Tweel, Jr.
*Attorney, Agent, or Firm*—Westman, Champlin & Kelly, P.A.

[57] ABSTRACT

A vehicle current drain tester tests nominal current drain through a vehicle electrical system while preserving on-board vehicle memory. The tester includes a measurement current loop, an offset circuit and a fail indicator. The current loop includes first and second tester terminals for connection to the electrical circuit, first and second voltage source terminals for connection to a voltage source and a current sensor. The current sensor generates a measurement signal in response to current flowing in the current loop. The offset circuit is coupled to the current sensor and applies an offset to the measurement signal which represents a selected drain current level in the vehicle. The offset circuit generates a fail output signal as a function of whether the measurement signal exceeds the offset. The fail indicator is coupled to the offset circuit and is responsive to the fail output signal.

20 Claims, 6 Drawing Sheets

VEHICLE CURRENT DRAIN TESTER WITH MEMORY SAVER

CROSS REFERENCE TO RELATED APPLICATION

This application is a continuation-in-part of Makhija U.S. patent application Ser. No. 08/570,589, entitled "VEHICLE CURRENT DRAIN TESTER," which was filed on Dec. 11, 1995, and is hereby incorporated by reference.

BACKGROUND OF THE INVENTION

The present invention relates to a vehicle current drain tester and, more particularly, to a tester having a vehicle memory saver.

A typical vehicle electrical system includes a battery which powers an ignition system and various accessories, such as lights, a radio, power windows, a clock, an on-board computer and associated memory. Present day vehicles have a small amount of current drain on the vehicle battery even when the engine is not running. When the engine is not running, the battery must still provide power to certain accessories, such as the clock and the on-board computer memory. In a properly operating vehicle, the nominal current drain on the battery preferably does not drain the battery to less than 50% of the state of charge in four to five weeks if the vehicle is not driven during that period. The actual time for discharge could vary depending upon the size of the battery and the actual vehicle current drain.

Nominal current drain can be measured by disconnecting the vehicle's ground cable from the negative battery terminal and measuring the current between these two points with an ampere-meter. The resulting current reading is an indication of the nominal current drain on the battery. However, the ampere-meter introduces an additional load into the circuit which changes the current and causes the current reading to be different from the nominal current drain on the battery. The operator must correct the current reading to cancel the effects of connecting the amperemeter into the circuit and then compare the corrected current reading with a specification for the vehicle being tested. This procedure requires a relatively skilled operator and even then is susceptible to errors in the current reading itself or in the correction. The procedure also consumes a relatively large amount of time since corrections must be made and then analyzed before a pass/fail determination can be made.

Another problem associated with traditional ampere-meters is that the operator must first select an appropriate ampere range for the measurement, such as a milliamp range. If the selected range is too small, connecting the meter into the circuit will "blow" a safety fuse in the meter. The fuse must then be replaced. Even if the correct range is selected for a vehicle's nominal current drain, the operator may mistakenly open a vehicle door or turn on an accessory which greatly increases the current flow through the meter resulting in another blown fuse. Traditional ampere-meters also have small clip leads which are not well suited for automotive applications. The small clip leads are difficult to clip to large automotive parts and typically have too short connecting leads.

Also, when disconnecting the battery to make the current drain measurement or to replace or recharge the battery, it is desirable to supply current to the vehicle memory and the clock to prevent losing data or disrupting the clock. Several different devices have been used to provide stand by power to the vehicle, such as battery packs or power packs, which plug into a 110 Volt AC line. Power is supplied to the vehicle through the cigarette lighter or through the vehicle battery cables before the battery is disconnected. These devices are typically expensive and inconvenient to use.

SUMMARY OF THE INVENTION

The vehicle current drain tester of the present invention tests nominal current drain through a vehicle electrical system while preserving on-board vehicle memory. The tester includes a measurement current loop, an offset circuit and a fail indicator. The current loop includes first and second tester terminals for connection to the electrical circuit, first and second voltage source terminals for connection to a voltage source and a current sensor. The current sensor generates a measurement signal in response to current flowing in the current loop. The offset circuit is coupled to the current sensor and applies an offset to the measurement signal which represents a selected drain current level in the vehicle. The offset circuit generates a fail output signal as a function of whether the measurement signal exceeds the offset. The fail indicator is coupled to the offset circuit and is responsive to the fail output signal.

DETAILED DESCRIPTION OF THE PREFERRED EMBODIMENTS

Figure 1:
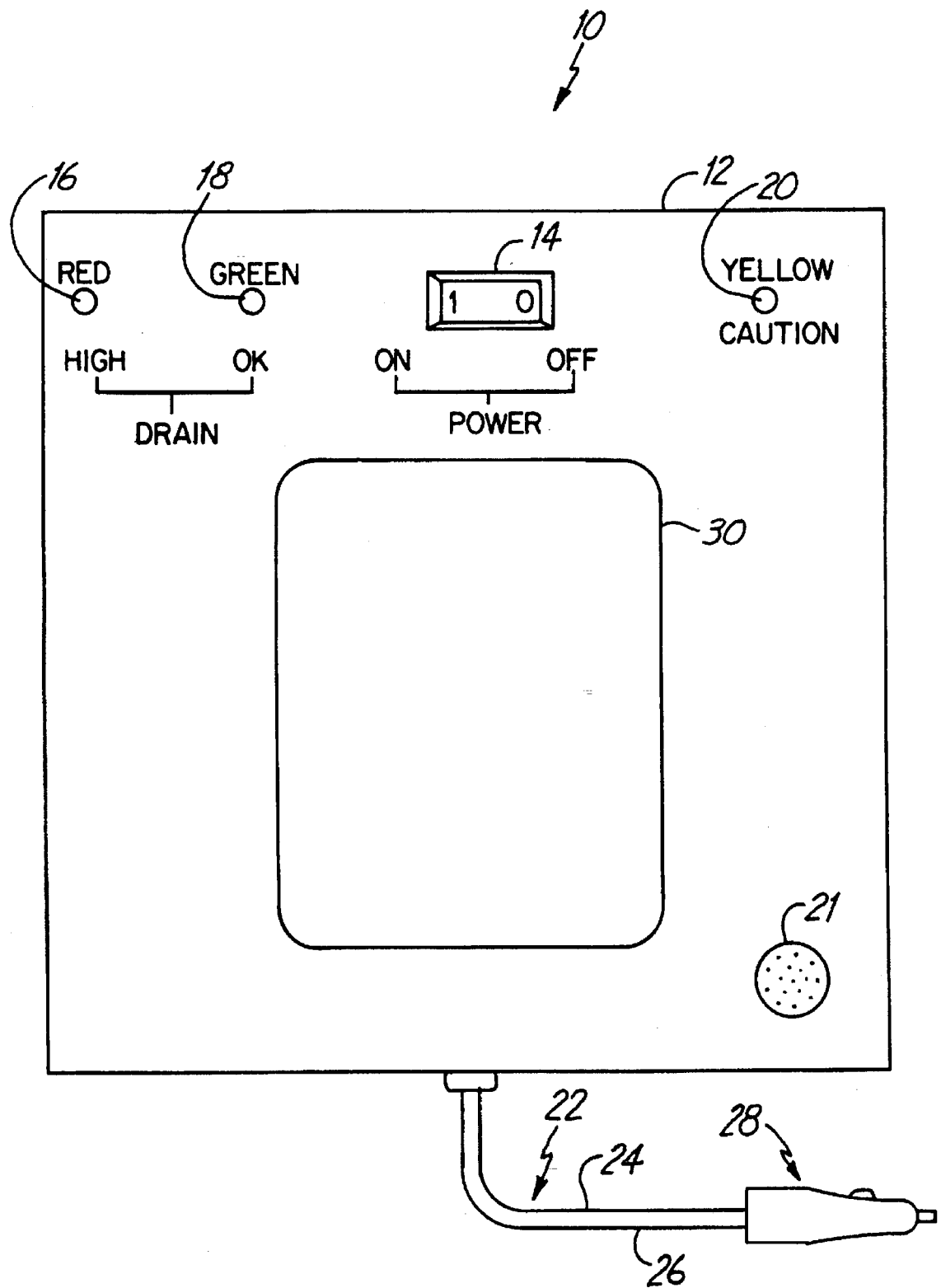
FIG. 1 is a top plan view of a vehicle current drain tester according to the present invention.

FIG. 1 is a top plan view of a vehicle current drain tester according to the present invention. Tester 10 includes housing 12, power switch 14, light emitting diode (LED) 16, LED 18, LED 20, audible alert 21 and cable 22. Power switch 14 controls power to internal measurement circuitry and over cable 22. Cable 22 connects tester 10 to an electrical system of a vehicle to be tested. Cable 22 includes positive and negative leads 24 and 26 which are coupled to a male-type cigarette lighter plug 28. A label 30 is attached to housing 12 to indicate a test procedure for connecting tester 10 to the vehicle and for making a current drain measurement. The results of the measurement are displayed through LED's 16, 18 and 20.

LED 16 is a red LED which operates as a "fail" indicator. LED 16 is illuminated when the current drain measurement is unacceptably high. LED 18 is a green LED which operates as a "pass" indicator. LED 18 is illuminated when the current drain measurement is acceptable. LED 20 is a yellow LED which operates as a "warning" indicator. LED 20 is illuminated when the current drain measurement is slightly high, but still acceptable.

Electrical systems of many vehicles are controlled by an on-board computer. Once the ignition is turned off, the computer shuts down most of the power accessories and leaves certain accessories on for a period of about three minutes. These accessories may include power windows, alarm systems and cellular phones, for example. After the three-minute period, the on-board computer enters a "sleep" mode which shuts off the remaining accessories except for key components such as the clock and the computer memory. With certain vehicles, the yellow LED may indicate that the vehicle's on-board computer has not yet entered the sleep mode. Although indicators 16, 18 and 20 include LED's in the embodiment shown in FIG. 5, the indicators can include a variety of visual, audible or other devices capable of being perceived by the operator.

Figure 2:
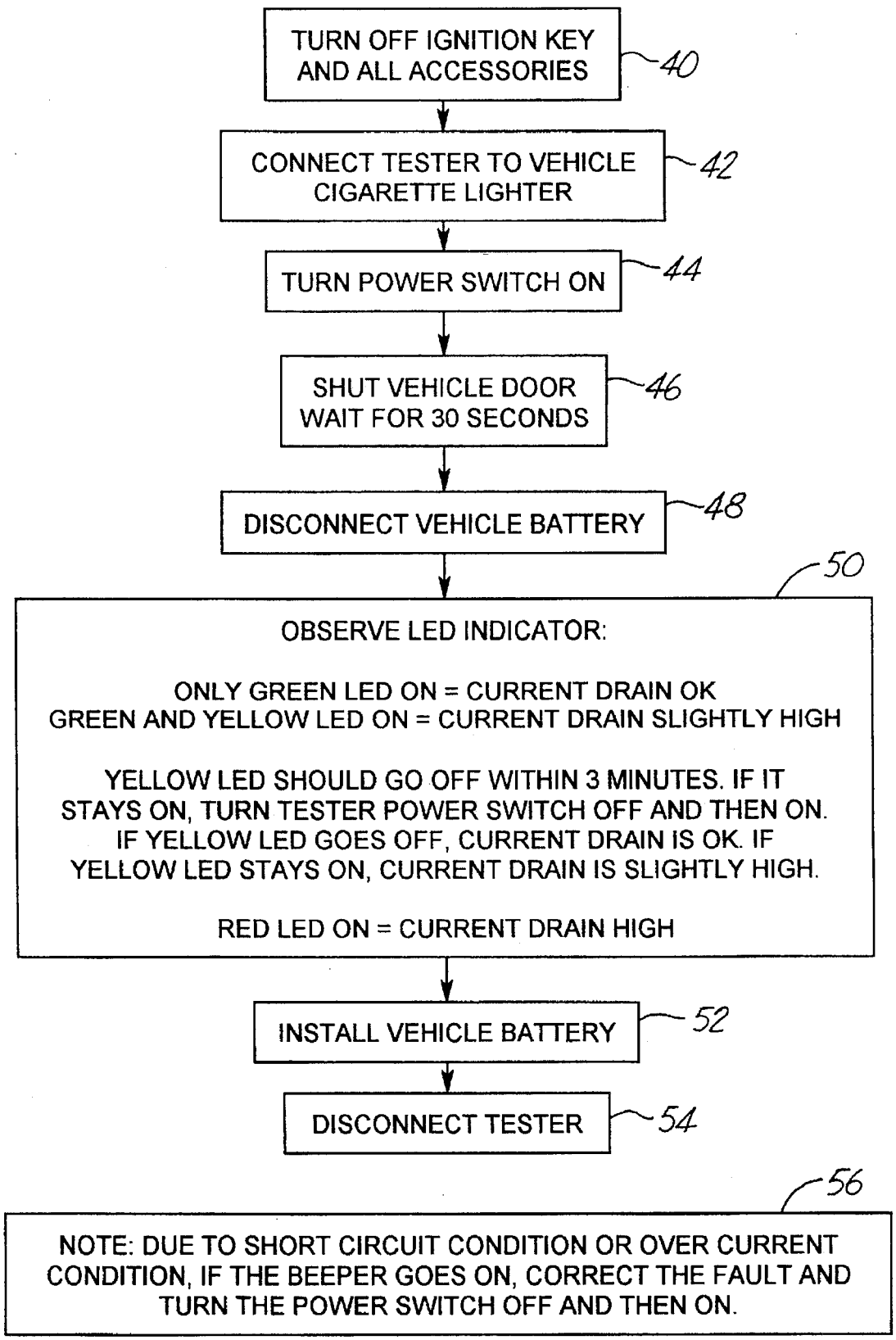
FIG. 2 is a flow chart of a test procedure according to one embodiment of the present invention.

FIG. 2 is a flow chart of a test procedure according to one embodiment of the present invention. Step 40 instructs the operator to turn off the ignition key and all accessories. At step 42, the operator connects plug 28 (FIG. 1) to the vehicle cigarette lighter socket. At step 44, the operator turns power switch 14 on. The operator then shuts the vehicle door, at step 46, and waits for 30 seconds. Next, the operator disconnects the vehicle battery, at step 48.

Once the battery has been disconnected, the operator observes LED's 16, 18 and 20. If only green LED 18 is on, then the measured current drain is acceptable. If green LED 18 and yellow LED 20 are both on, the current drain is slightly high. Yellow LED 20 should go off within three minutes. If it stays on, the operator is instructed to turn power switch 14 off and then on to force the vehicle's on-board computer into the low current drain sleep mode. If yellow LED 20 goes off, the current drain is acceptable. If yellow LED 20 stays on, the current drain is slightly high. Finally, if red LED 16 is on, the current drain is high. At step 52 the operator is instructed to install the vehicle battery. Once the vehicle battery has been installed, the operator may disconnect tester 10, at step 54. The test procedure is then complete.

Figure 3:
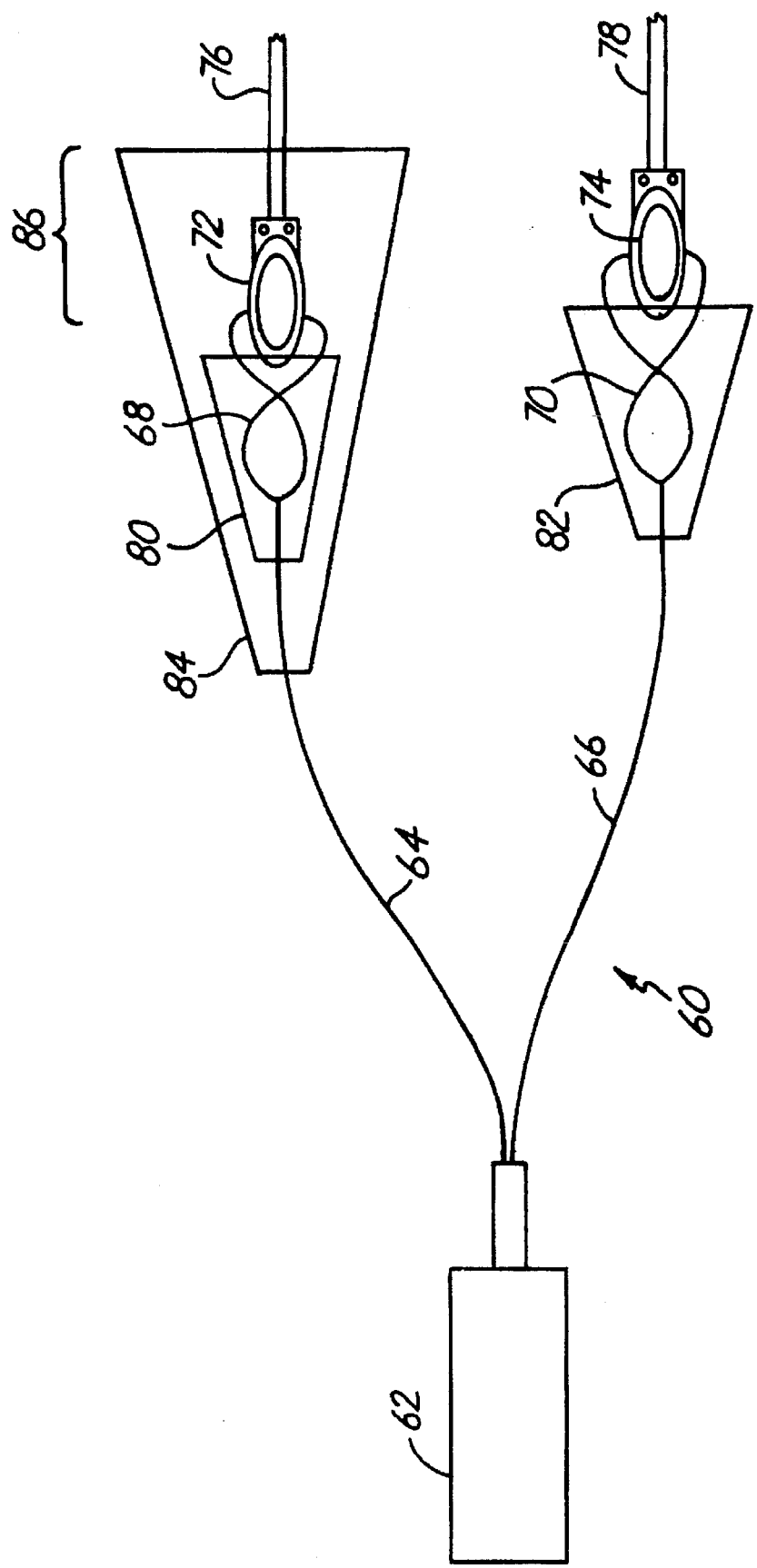
FIG. 3 is a diagram of an adapter cable according to the present invention.

If a short circuit condition or overcurrent condition occurs, tester 10 alerts the operator through audible alert 27 in this situation, the operator is instructed, at step 56, to correct the fault and then turn power switch 14 off and then on. Audible alert device 21 includes a beeper or buzzer for example Some vehicles disconnect power to the cigarette lighter when the ignition key is turned off. With these vehicles, an adapter cable is used to connect tester 10 to the vehicle positive and negative cables instead of the cigarette lighter. FIG. 3 is a diagram of an adapter cable 60 according to the present invention. Adapter cable 60 includes female-type cigarette lighter adaptor 62 and cables 64 and 66. Cables 64 and 66 include automotive alligator-type electrical clamps 68 and 70, for example, for coupling to connectors 72 and 74 of the vehicle positive and negative battery cables 76 and 78, respectively.

Cables 64 and 66 further include conical shaped insulating boots so and 82 which electrically insulate clamps 68 and 70 from unintentional contact with metal components of the vehicle. Positive cable further includes an extended boot or sleeve 84 which is slidably attached to cable 64. Boot 80 extends beyond a distal end of clamp 68 a distance 86 that is sufficient to insulate both clamp 68 and connector Clamp 68 can be attached to or detached from connector 72 by simply sliding boot 84 back along cable 64 until the clamp can be accessed by the operator. An interior surface of boot 84 preferably mates with an exterior surface of boot 80 such that boot 84 frictionally engages boot 80 when boot 84 is slid outwardly along cable 64. When battery positive cable 76 is disconnected from the vehicle battery, the cable typically dangles somewhere within the engine compartment of the vehicle and has a high probability of shorting to the vehicle ground. Boot 84 provides a convenient insulation for cable 76 during the test procedure. Boots 80, 82 and 84 are color coded red and black to indicate relative polarity of the cables. In an alternative embodiment, boot 80 is eliminated.

Figure 4:
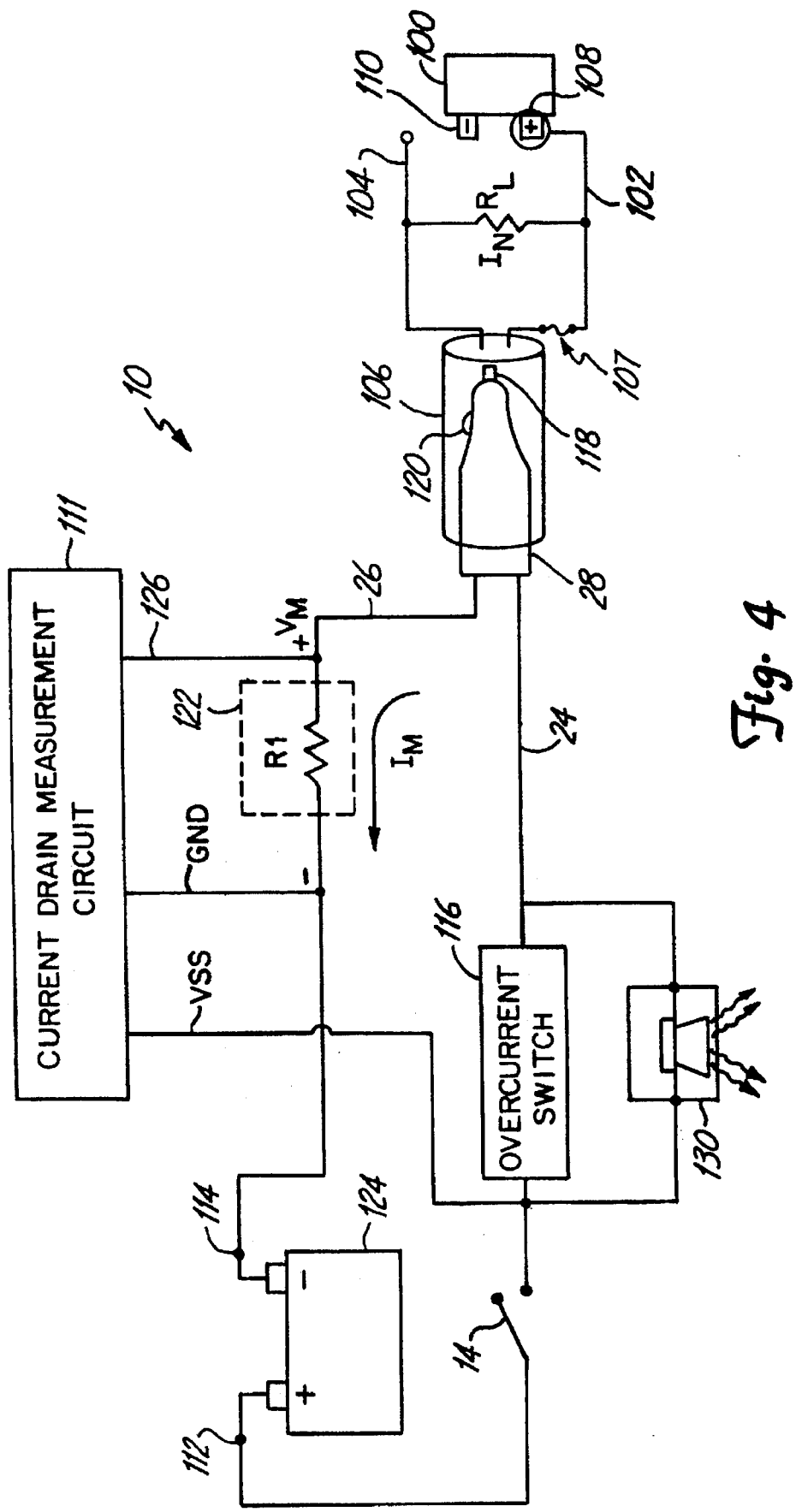
FIG. 4 is a block diagram of the vehicle current drain tester of the present invention coupled to a vehicle electrical system.

FIG. 4 is a block diagram showing tester 10 coupled to a vehicle electrical system. The vehicle electrical system includes battery 100, vehicle positive cable 102, vehicle ground cable 104, load $R_L$, cigarette lighter socket 106 and fuse 107. Battery 100 includes positive and negative battery terminals 108 and Load $R_L$ represents a nominal load on battery 100 when the vehicle engine is turned off. Nominal current drain $I_N$ through load $R_L$ is measured by inserting plug 28 into cigarette lighter socket 106 and disconnecting vehicle ground cable 104 from negative battery terminal 108, as shown in FIG. 4.

Tester 10 includes a current drain measurement circuit 111 and a measurement current loop formed by battery terminals 112 and 114, power switch overcurrent switch 116, plug 28 and current sensor 122. A battery 124 is coupled between battery terminals 112 and 114 for providing power to the vehicle electrical circuit through terminals 118 and 120 of plug 28 and to current drain measurement circuit 111 through voltage supply terminal VSS. Battery 124 includes a 12-Volt, 6.5 AHR sealed lead acid battery. However, battery 124 can include any suitable battery for powering the vehicle electrical system. A sealed lead acid battery is preferred because it has a low cost for the number of kilowatt hours available, is maintenance free, is totally sealed, has a fairly long life and can withstand numerous charge and discharge cycles.

Power switch 14 switches the power on or off to plug 28 and to current drain measurement circuit 111. When power switch 14 is closed, a measurement current $I_M$ flows from positive battery terminal 112, through power switch 14, overcurrent switch 116, plug terminal 118, load $R_L$, plug terminal 120, current sensor 122 and into negative battery terminal 114.

Current sensor 122 includes a resistor R1. Resistor R1 performs two functions. First, resistor R1 shunts current across current drain measurement circuit 111 for making vehicle current drain measurements. Second, resistor R1 limits the amount of current that can be drawn instantly from battery 124 when a shorn circuit condition occurs. In one embodiment, resistor R1 includes a 0.25 Ohm resistor having a one percent precision and a 10 watt rating.

Current drain measurement circuit 111 has a measurement node 126 and a ground terminal GND which are coupled across resistor R1. Resistor R1 develops a measurement voltage $V_M$ between measurement node 126 and ground terminal GND which is a function of the measurement current $I_M$. Current drain measurement circuit 111 senses measurement voltage $V_M$ and selectively actuates indicators 16, 18 and 20 (shown in FIG. 1) as a function of the measured voltage. Connecting tester 10 to the vehicle electrical system adds an additional load which changes the current flowing through the system. Thus, measurement current $I_M$ is not the actual nominal current drain $I_N$, but is representative of the nominal current drain $I_N$. Current drain measurement circuit 111 automatically compensates for the additional lead when making current drain measurements.

Overcurrent switch 116 protects current drain measurement circuit 111 against excessive current, voltage and temperature. An excessive condition can occur if the operator inadvertently touches battery positive lead 102 to the vehicle ground after disconnecting it from the vehicle battery 100 or if the operator tries to start the vehicle with tester plugged into cigarette lighter socket 106. Overcurrent switch 116 includes a self-resettable semiconductor switch, such as a POLYSWITCH®, manufactured by Raychem Corporation of Menlo Park, Calif. Overcurrent switch 116 has a very low resistance when the measurement current $I_M$ is lower than a first threshold current level and has a very high resistance when the measurement current $I_M$ is greater than the threshold level. The switch operates similar to a fuse or a circuit breaker, but is self-resettable. Once the switch is triggered into the high resistance state, a small self-heating current flowing through the switch maintains the high resistance until the overcurrent fault is corrected.

The threshold current level is set high enough to pass expected currents but low enough to be below the current rating of cigarette lighter fuse 107. In one embodiment, the threshold is lower than the lowest rated cigarette lighter fuse in any of the vehicles to be tested. However, the switch must still pass normal currents expected once the ignition key is turned off and the vehicle door is shut. Overcurrent switch 116 can be replaced with any fuse or circuit breaker, for example. However, a POLYSWITCH® device is preferred since it requires no manual resetting or replacement as required by a circuit breaker or fuse. The POLYSWITCH® device is also significantly less expensive than a circuit breaker.

Audible alert device 130 is coupled in parallel with overcurrent switch 116. Audible alert device 130 can include any audible device, such as a beeper or buzzer. Audible device 130 can also be replaced with a visual fault indicator. Device 130 operates on a 12 Volt DC voltage. Under a normal load condition, there is a very small voltage drop across overcurrent switch 116 so that device 130 is off. Under an overcurrent condition, overcurrent switch 116 switches to the high resistance state and most of the battery voltage from battery 124 appears across switch 116 such that device 130 turns on and warns the operator to correct the fault. The operator can then correct the fault before making a current drain measurement.

Figure 5:
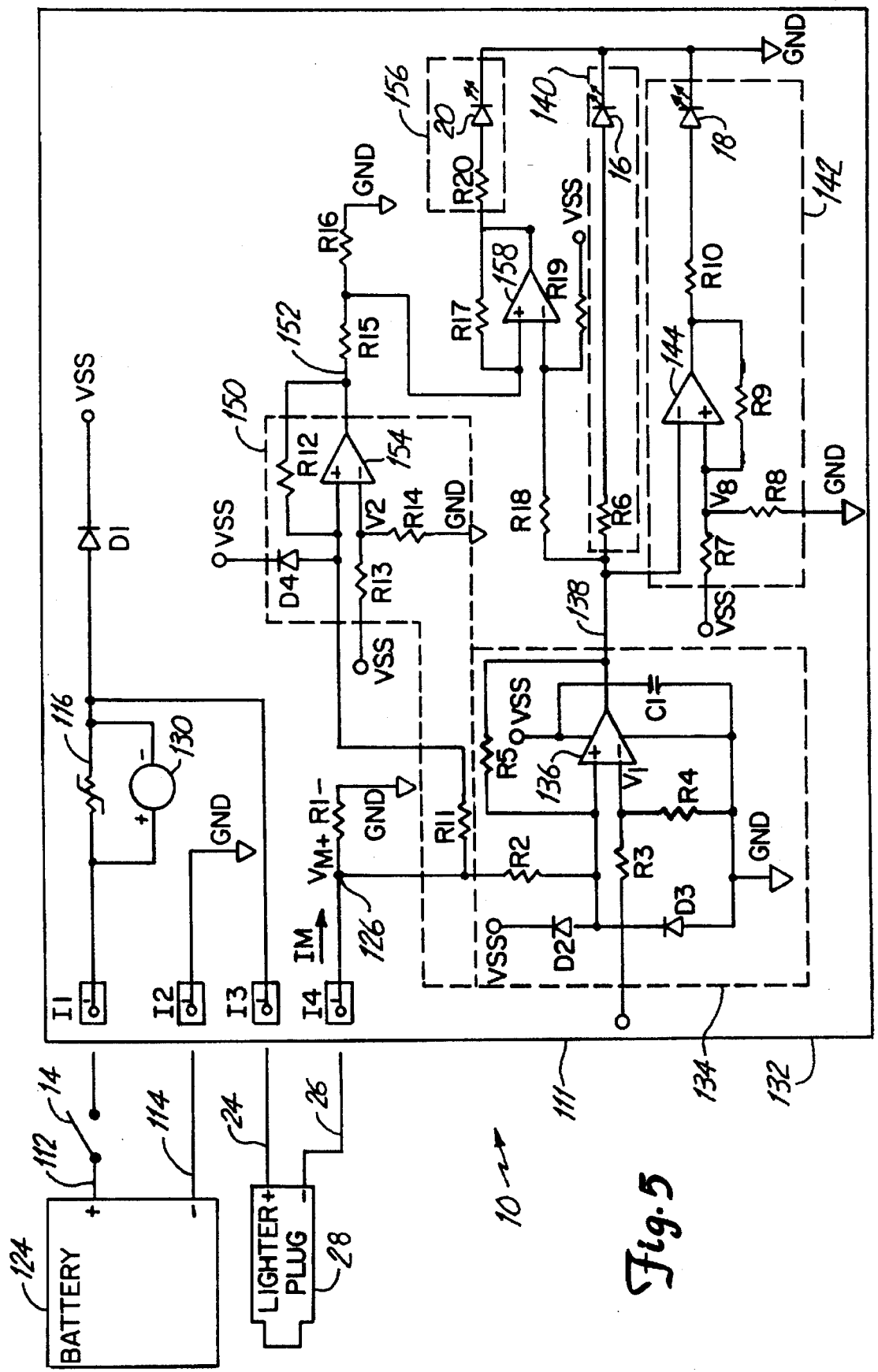
FIG. 5 is a schematic diagram which illustrates the vehicle current drain tester in greater detail.

FIG. 5 is a schematic diagram which illustrates tester 10 in greater detail. The various components of tester 10 are mounted on a printed circuit board 132, which has input-output terminals I1, I2, I3 and I4. Battery 124 is coupled to terminals I1 and I2 through power switch 14. Cigarette lighter plug 28 is coupled to terminals I3 and I4. Audible alert device 130 is coupled in parallel with overcurrent switch 116 between terminals I1 and the anode of diode D1. The cathode of diode D1 is coupled to voltage supply terminal VSS. Diode D1 is a protection diode which protects the various components of tester 10 in case battery 124 is connected backwards to terminals 112 and 114. Terminal I2 is coupled to ground terminal GND. Terminal I3 is coupled to the anode of diode D1 and provides power to plug 28 from voltage supply terminal VSS. Shunt resistor R1 is coupled between terminal I4 and ground terminal GND. Shunt resistor R1 develops measurement voltage $V_M$ at measurement node 126 relative to ground terminal GND in response to the measurement current $I_M$.

A first offset circuit 134 is coupled to measurement node 126. Offset circuit 134 includes resistors R3, R4, R5 and R6, Schottky diodes D2 and D3, operational amplifier 136 and capacitor C1. Resistor R2 is a current limiting resistor which is coupled between measurement node 126 and the non-inverting input of operational amplifier 136. Diode D2 is coupled between the non-inverting input of amplifier 136 and voltage supply terminal VSS. Diode D3 is coupled between the non-inverting input of amplifier 136 and ground terminal GND. Diodes D2 and D3 protect amplifier 136 from overvoltages received from the vehicle through cigarette lighter plug 28. The inverting input of amplifier 136 is coupled to a voltage divider formed by resistors R3 and R4 which are coupled together in series between voltage supply terminal VSS and voltage ground terminal GND. Resistors R3 and R4 have resistances that are selected to generate a first offset voltage $V_1$ which represents a maximum nominal current drain of a properly operating vehicle, with tester 10 disconnected from the vehicle. In one embodiment, offset voltage $V_1$ represents a nominal current drain of 240 mA. The offset current can be selected based on empirical data or the vehicle specifications, for example. The maximum nominal current drain can be selected to match particular vehicle specification or can be selected to be slightly greater than a maximum current drain of a variety of vehicles.

Amplifier 136 is coupled between voltage supply terminal VSS and voltage ground terminal GND. Capacitor C1 is a bypass capacitor which is coupled between voltage supply terminal VSS and ground terminal GND at amplifier 136. Resistor R5 is a hysteresis control resistor which is coupled between fail output 138 and the non-inverting input of amplifier 136. Fail indicator 140 is coupled to fail output 138 and includes resistor R6 and LED 16, which are coupled in series between fail output 138 and ground terminal GND.

In operation, operational amplifier 136 forms a comparator which compares the measurement voltage $V_M$ with the first offset voltage $V_1$ and generates a high voltage on fail output 138 when measurement voltage $V_M$ exceeds the first offset voltage $V_1$. When fail output 138 has a high voltage, LED 16 turns on to indicate that the measurement current $I_M$ exceeds the selected maximum nominal current drain.

Tester 10 further includes a pass indicator 142. Pass indicator 142 includes resistors R7, R8, R9 and R10, operational amplifier 144 and LED 18. The inverting input of amplifier 144 is coupled to fail output 138. The non-inverting input of amplifier 144 is coupled to a voltage divider formed by resistors R7 and R8 which are coupled in series between voltage supply terminal VSS and ground terminal GND. Resistor R9 is coupled between the output of amplifier 144 and the non-inverting input of amplifier 144. Resistors R7 and R8 have resistances that are selected to generate a bias voltage $V_B$ which is between the high and low voltage levels generated on fail output 138. Therefore, when fail output 138 has a high voltage level, the output of amplifier 144 has a low voltage level and when fail output 138 has a low voltage level, the output of amplifier 144 has a high voltage level. Resistor R10 and LED 18 are coupled in series between the output of amplifier 144 and ground terminal GND. When the output of amplifier 144 has a high voltage level, LED 18 turns on indicating that the measurement current $I_M$ is less than the nominal current drain of a properly operating vehicle. Therefore, when LED 16 is on, LED 18 is off and when LED 16 is off, LED 18 is on.

Tester 10 further includes a second offset circuit 150 which is coupled between measurement node 126 and warning output 152. Offset circuit 150 includes resistors R11, R12, R13 and R14, diode D4 and operational amplifier 154. Resistor R11 is a current limiting resistor which is coupled between measurement node 126 and the non-inverting input of amplifier 154. Diode D4 is coupled between voltage supply terminal VSS and the non-inverting input of amplifier 154. Resistor R12 is a hysteresis control resistor which is coupled between the non-inverting input of amplifier 154 and warning output 152. The inverting input of amplifier 154 is coupled to a voltage divider by resistors R13 and R14, which are coupled together in series between voltage supply terminal VSS and ground terminal GND.

Resistors R13 and R14 have resistances that are selected to generate a second offset voltage $V_2$, which represents a drain current that is less than the maximum nominal drain current represented by offset voltage $V_1$. In one embodiment, the second offset voltage represents a drain current that is less than the maximum nominal drain current and greater than a typical drain current with the vehicle in sleep mode. For example, offset voltage $V_2$ may represent a drain current of 110 mA. If the measurement current $I_M$ exceeds 110 mA, the measurement voltage $V_M$ will exceed offset voltage $V_2$ such that amplifier 154 will generate a high voltage level on warning output 152, which drives warning indicator 156.

Tester 10 further includes a comparator formed by operational amplifier 158 which prevents warning indicator 156 from turning on when fail indicator 140 is on. Warning output 152 is coupled to the non-inverting input of amplifier 158 through a voltage divider formed by resistors R15 and R16. Resistors R15 and R16 are coupled together in series between warning output 152 and ground terminal 158. Resistor R17 is coupled between the non-inverting input of amplifier 158 and the output of amplifier 158. Fail output 138 is coupled to the inverting input of amplifier 158 through resistor R18. Resistor R19 is coupled between the inverting input of amplifier 158 and voltage supply terminal VSS.

Warning indicator 156 includes resistor R20 and LED 20 which are coupled together in series between the output of amplifier 158 and ground terminal GND. The resistances of resistors R15, R16, R18 and R19 are selected such that when fail output 138 has a high voltage level, the voltage at the inverting input of amplifier 158 exceeds the voltage at the non-inverting input of amplifier 158 such that the output of amplifier 158 is low. Therefore, warning indicator 156 does not turn on if fail indicator 140 is on, even though the measured current $I_M$ may exceed 110 mA. If fail indicator 140 is off and warning indicator 156 is on, the current drain is acceptable, but slightly high.

Table 1 provides examples of electrical components which can be used in the embodiment shown in FIG. 5:

TABLE 1

| R1 | 0.25 Ω | R12 | 22 MΩ |
| --- | --- | --- | --- |
| R2 | 2.2 KΩ | R13 | 51 KΩ |
| R3 | 22 KΩ | R14 | 110 Ω |
| R4 | 100 Ω | R15 | 22 KΩ |
| R5 | 22 MΩ | R16 | 10 KΩ |
| R6 | 510 Ω | R17 | 10 MΩ |
| R7 | 10 KΩ | R18 | 6.8 KΩ |
| R8 | 680 Ω | R19 | 100 KΩ |
| R9 | 1 MΩ | R20 | 510 Ω |
| R10 | 510 Ω | C1 | 0.1 µf |
| R11 | 312 KΩ | | |

These components and characteristics are provided as examples only and can be changed as desired. In addition, operational amplifiers 136, 144, 154 and 158 are implemented with a quad LM324N operational amplifier.

In an alternative embodiment, the major functions of tester 10 are implemented in software or digital control circuitry. In particular, the decision making circuitry for resolving indicator outputs 140, 142 and 156 can be easily implemented with digital logic or software. In these embodiments, the measured current $I_M$ is converted into one or more digital values for analysis.

Figure 6:
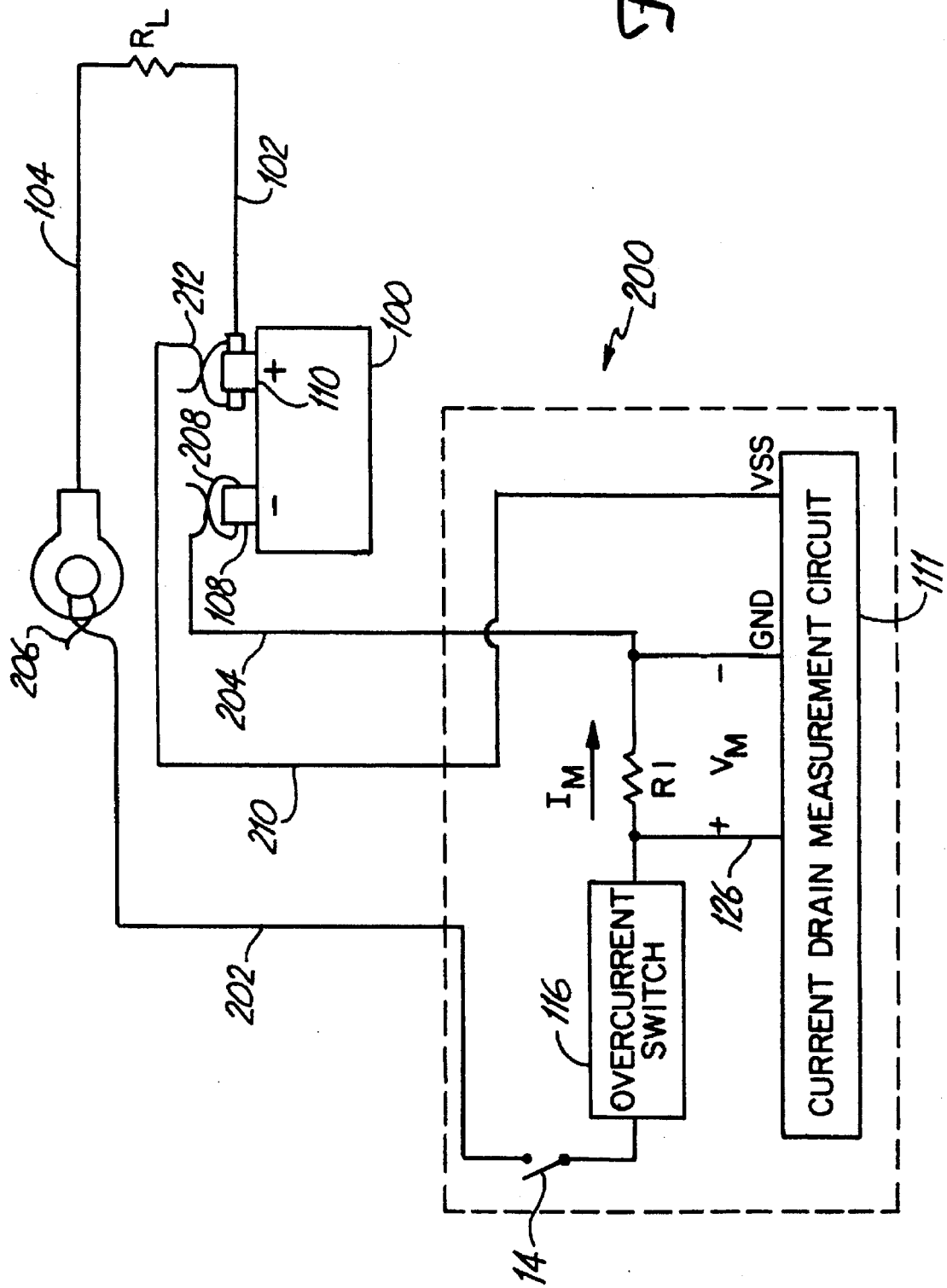
FIG. 6 is a block diagram of an alternative embodiment of the present invention.

FIG. 6 is a block diagram of an alternative embodiment of the present invention in which the vehicle current drain tester does not include an independent battery or voltage source, but rather uses the vehicle battery for preserving the on-board memory. The same reference numerals are used in FIG. 6 for similar elements as were used in the previous figures. Tester 200 includes current drain measurement circuit 111, shunt resistor R1, overcurrent switch 116 and power switch 14. Resistor R1, overcurrent switch 116 and power switch 14 are coupled in series between cables 202 and 204 for measuring the current flowing through vehicle load $R_L$.

Cable 202 has a clamp 206 which is coupled to vehicle ground cable 104, which is disconnected from negative battery terminal 108. Cable 204 has a clamp 208 which is coupled to negative battery terminal 108. Cable 204 is coupled in series with vehicle battery 100 with respect to the current loop formed by load $R_L$, shunt resistor R1, overcurrent switch 116 and power switch 14. Positive battery terminal 110 is coupled to vehicle positive cable 102 to complete the current loop. Tester 10 further includes a power cable 210 which is coupled to voltage supply terminal VSS and which has a clamp 212 coupled to positive battery terminal 110. Vehicle battery 100 therefore powers the vehicle electrical circuit and current drain measurement circuit 111.

Measurement current $I_M$ flows from positive battery terminal 110, through vehicle load $R_L$, vehicle ground cable 104, electrical cable 202, power switch 14, overcurrent switch 116, shunt resistor R1, electrical cable 204 and negative battery terminal 108. In order to preserve the vehicle's on-board memory, clamps 206 and 208 are coupled to vehicle ground cable 104 and negative battery terminal 108 before the vehicle ground cable 104 is disconnected from negative battery terminal 108 or very shortly thereafter. Tester 200 then maintains current flow through the vehicle's electrical circuit to maintain sufficient power to the on-board memory and other critical accessories.

The current drain tester of the present invention has an advantage of being very easy to use. The tester requires little or no input from the operator to determine whether the vehicle's current drain is excessive. The tester has an offset circuit which automatically determines whether the nominal current drain exceeds a predetermined level. The tester includes built-in protective circuitry which limits current flowing through the circuitry without requiring fuses or other expensive or inconvenient protection components. The tester requires a small number of components which are readily available and inexpensive.

Although the present invention has been described with reference to preferred embodiments, workers skilled in the art will recognize that changes may be made in form and detail without departing from the spirit and scope of the invention. For example, the tester can be implemented with a variety of circuit configurations. The configurations shown in FIGS. 2, 4 and 5 are provided as examples only. In addition, the various elements and terminals which are coupled in the measurement current loop can be coupled in any order. The tester can be implemented with discrete components or can be implemented wholly or partially in an integrated circuit. The major functions of the tester can also be implemented in software or digital control circuitry. The term "coupled" used in the specification and in the claims can include various types of connections or couplings and can include a direct connection or a connection through one or more intermediate components. The terms "fail" and "pass" are interchangeable since an inactive "failure" indicator indicates a "pass" state and an inactive "pass" indicator indicates a "fail" state. Likewise, an indication of whether a measurement current "exceeds" an offset is also an indication of whether the measurement current "is less than" the offset. The terms are therefore interchangeable in the specification and the claims. The various fail, pass and warning indicators can be used individually or in any combination.

What is claimed is:

1. A vehicle nominal current drain tester for testing nominal current drawn by a vehicle's electrical circuit from the vehicle battery when the ignition is off, the tester comprising:

a measurement current loop comprising:
first and second tester terminals for connection in series with the electrical circuit;
first and second voltage source terminals coupled in series with the first and second tester terminals; and
a current sensor coupled in series with the first and second tester terminals and the first and second voltage source terminals, which generates a measurement signal representative of nominal current drawn by the electrical circuit through the measurement current loop;
a first offset circuit coupled to the current sensor which applies a first offset to the measurement signal and provides a fail output as a function of whether the measurement signal exceeds the first offset, wherein the first offset represents a first selected nominal drain current level drawn by the electrical circuit when the ignition is off; and
a fail indicator coupled to the first offset circuit and responsive to the fail output.

2. The vehicle nominal current drain tester of claim 1 wherein the measurement current loop further includes a battery coupled between the first and second voltage source terminals.

3. The vehicle nominal current drain tester of claim 2 wherein the battery comprises a 12 Volt sealed lead acid battery.

4. The vehicle nominal current drain tester of claim 1 wherein the measurement current loop further includes a power switch.

5. The vehicle nominal current drain tester of claim 1 wherein the measurement current loop further includes a self-resettable semiconductor switch having a first resistance when the current flowing through the measurement current loop is lower than a first threshold current level and having a second, higher resistance when the current flowing through the current loop is greater than the threshold level.

6. The vehicle nominal current drain tester of claim 5 wherein the vehicle's electrical circuit comprises a fuse which is triggered at a second threshold current level and wherein:
the first threshold current level is less than the second threshold current level.

7. The vehicle nominal current drain tester of claim 5 and further comprising an audible alert device coupled to the resettable semiconductor switch, which is activated when the switch has the second resistance.

8. The vehicle nominal current drain tester of claim 1 and further comprising a male-type cigarette lighter plug coupled to the first and second tester terminals.

9. The vehicle nominal current drain tester of claim 8 wherein the vehicle's electrical circuit comprises positive and negative battery cables having electrical connectors and wherein the tester further comprises an adapter including:
a female-type socket for coupling to the male-type cigarette lighter plug;
positive and negative electrical cables coupled to the female-type socket;

first and second electrical clamps coupled to the positive and negative electrical cables, respectively; and
an electrical insulating sleeve extending over the first clamp and beyond a distal end of the first clamp a distance that is great enough to insulate the first clamp and the electrical connector of the positive battery cable when the first clamp is clamped onto the positive battery cable.

10. The vehicle nominal current drain tester of claim 1 wherein the vehicle comprises positive and negative battery cables and a battery having positive and negative battery terminals and wherein:
the first tester terminal comprises a first electrical cable having a first electrical clamp for connection to the negative battery cable;
the second tester terminal comprises a second electrical cable having a second electrical clamp for connection to the negative battery terminal;
the second electrical clamp forms the first voltage source terminal; and
the second voltage source terminal comprises a third electrical cable having a third electrical clamp for connection to the positive battery terminal and the positive battery cable.

11. The vehicle nominal current drain tester of claim 1 wherein the current sensor comprises a resistor.

12. The vehicle nominal current drain tester of claim 1 and further comprising:
a pass indicator coupled to the fail output, wherein the pass and fail indicators have active and inactive states and wherein the pass indicator is in the active state when the fail indicator is in the inactive state.

13. The vehicle nominal current drain tester of claim 12 and further comprising:
a comparator having first and second inputs and a comparator output, wherein the first input is coupled to the fail output and the comparator output is coupled to the pass indicator; and
a bias circuit coupled to the second input of the comparator.

14. The vehicle nominal current drain tester of claim 1 and further comprising:
a second offset circuit coupled to the current sensor which applies a second offset, which is less than the first offset, to the measurement signal and provides a warning output as a function of whether the measurement signal exceeds the second offset; and
a warning indicator coupled to the warning output.

15. The vehicle nominal current drain tester of claim 14 and further comprising:
a comparator having first and second inputs and a comparator output, wherein the first input is coupled to the warning output, the second input is coupled to the fail output and the comparator output is coupled to the warning indicator.

16. A vehicle current drain tester for testing current drain through an electrical circuit in a vehicle having an on-board memory, comprising:
means for providing power to the vehicle's electrical circuit;
means for sensing current flow in the electrical circuit and generating a measurement signal indicative of the current flow;
first offset means for offsetting the measurement signal with a first offset representative of a predetermined maximum drain current;

first indicating means for indicating whether the measurement signal exceeds the first offset;

second offset means for offsetting the measurement signal with a second offset, which is less than the first offset; and second indicating means for indicating whether the measurement signal exceeds the second offset.

17. The vehicle current drain tester of claim 16 wherein the first indicating means comprises:

means for indicating that the measurement signal exceeds the first offset; and means for indicating that the measurement signal is less than the first offset.

18. The vehicle current drain tester of claim 16 and further comprising means for blocking the second indicating means when the measurement signal exceeds the first offset.

19. A vehicle nominal current drain tester for testing nominal current drawn by a vehicle's electrical circuit from the vehicle battery when the ignition is off, the tester comprising:

a measurement current loop comprising:

first and second tester terminals for connection in series with the electrical circuit;

first and second voltage source terminals coupled in series with the first and second tester terminals; and a current sensor coupled in series with the first and second tester terminals and the first and second voltage source terminals, which generates a measurement signal representative of nominal current drawn by the electrical circuit through the measurement current loop;

a voltage offset generator providing an offset voltage which represents a selected nominal drain current level drawn by the electrical circuit when the ignition is off;

a comparator having first and second inputs and a comparator output, wherein the first input is coupled to the current sensor, the second input is coupled to the voltage offset generator and the comparator output provides a fail output in response to a comparison of the measurement signal and the offset voltage; and a fail indicator coupled to the comparator output and responsive to the fail output.

20. The vehicle current drain tester of claim 19 wherein the fail indicator comprises a light emitting diode coupled to the comparator output.

\* \* \* \* \*

UNITED STATES PATENT AND TRADEMARK OFFICE
CERTIFICATE OF CORRECTION

PATENT NO. : 5,629,680
DATED : May 13, 1997
INVENTOR(S) : Surender K. Makhija

It is certified that error appears in the above-indentified patent and that said Letters Patent is hereby corrected as shown below:

On the title page,
Under [56] References cited:

Add the following reference, --3,666,959 05/1972 Crews 307/10BP--.

In column 7 under Table 1:

Delete "312KΩ" and insert --3.2KΩ--.

Signed and Sealed this

Twenty-fifth Day of November, 1997

Attest:

BRUCE LEHMAN

Attesting Officer    Commissioner of Patents and Trademarks